(12) United States Patent
Nerses et al.

(10) Patent No.: US 6,178,275 B1
(45) Date of Patent: Jan. 23, 2001

(54) METHOD AND APPARATUS FOR MODULATION OF GUIDED PLASMONS

(75) Inventors: Annita Nerses; Erich E. Kunhardt, both of Hoboken, NJ (US)

(73) Assignee: The Trustees of the Stevens Institute of Technology, Hoboken, NJ (US)

( * ) Notice: Under 35 U.S.C. 154(b), the term of this patent shall be extended for 0 days.

(21) Appl. No.: 09/403,997

(22) PCT Filed: Apr. 30, 1998

(86) PCT No.: PCT/US98/08765
§ 371 Date: Apr. 19, 2000
§ 102(e) Date: Apr. 19, 2000

(87) PCT Pub. No.: WO98/49587
PCT Pub. Date: Nov. 5, 1998

Related U.S. Application Data

(60) Provisional application No. 60/045,320, filed on May 1, 1997.

(51) Int. Cl.[7] ........................................................ G02B 6/12
(52) U.S. Cl. ..................................... 385/14; 385/1; 385/2; 385/15; 385/16
(58) Field of Search ................................... 385/1, 2, 3, 14, 385/15, 16, 131, 132, 88

(56) References Cited

U.S. PATENT DOCUMENTS

| | | | |
|---|---|---|---|
| 4,581,621 | * | 4/1986 | Reed .................................. 385/14 X |
| 4,783,427 | * | 11/1988 | Reed et al. ............................. 437/90 |
| 4,923,264 | * | 5/1990 | Langer et al. ......................... 385/2 X |
| 5,048,907 | * | 9/1991 | Wickman et al. ........................ 385/2 |
| 5,067,788 | * | 11/1991 | Jannson et al. ............................ 385/2 |
| 5,105,232 | * | 4/1992 | del Alamo et al. ................. 385/14 X |
| 5,157,744 | * | 10/1992 | Korotky ..................................... 385/2 |
| 5,239,517 | * | 8/1993 | Mariani ................................. 367/140 |
| 5,291,034 | * | 3/1994 | Allam et al. .......................... 359/248 |
| 5,485,018 | * | 1/1996 | Ogawa et al. ...................... 385/14 X |
| 5,493,625 | * | 2/1996 | Glance ................................... 385/24 |
| 5,612,233 | * | 3/1997 | Roesner et al. ......................... 437/40 |
| 5,751,466 | * | 5/1998 | Dowling et al. .................... 385/14 X |
| 6,028,693 | * | 2/2000 | Fork et al. .......................... 385/14 X |
| 6,034,809 | * | 3/2000 | Anemogiannis .......................... 385/2 |
| 6,052,495 | * | 4/2000 | Little et al. ............................... 385/2 |

* cited by examiner

Primary Examiner—Brian Healy
(74) Attorney, Agent, or Firm—Wolf & Samson

(57) ABSTRACT

The present invention relates to a method and apparatus for the generation, manipulation and detection of plasmon, and/or solitons, both linear and non linear, in semi-conductor heterostructures. The apparatus includes a galium arsonide substrate, a two-dimensional electron gas well (2-DEG) (160) form thereon and a thin layer of Aluminum galium arsonide (AlGaAs) placed thereover. Launcher (130) and receiver lines (132, 134, 136) are formed on the AlGaAs layer. Each of the launcher (130) and receiver lines (132, 134, 136) includes coplanar waveguides which preferably consist of two to three metal lines. One line is interconnected with a photoconductive switch (120) and can be pulsed. The other line or lines are grounded. Pulsing the line forms an electric field which can be detected. Between the launcher and (130) and the receiver (140), the plasmon can be modulated by one or more additional gates line extending over the 2-DEG.

15 Claims, 6 Drawing Sheets

METHOD AND APPARATUS FOR MODULATION OF GUIDED PLASMONS

This Application is a International 371 of PCT/US98/08765 filed Apr. 30, 1998 which claims benefit of Provisional No. 60/045,320 filed May 1, 1997.

BACKGROUND OF THE INVENTION

1. Field of the Invention

The present invention generally relates to the generation, manipulation and detection of plasmons in semi-conductor heterostructures, and more particularly to solitons and plasmons that can be utilized as a medium for signal transport, amplification and processing at high frequencies.

2. Related Art

In the past, surface acoustic wave (SAW) technology has been used to generate surface acoustic waves in the megahertz frequency range. This technology includes a launcher comprising a plurality of inter-digitated teeth and a receiver, positioned some distance away from the launcher, which likewise contains a plurality of inter-digitated teeth. By applying a signal to the inter-digitated teeth, a compression or surface wave is launched on the material and the wave moves throughout the material. The wave is a function of the frequency of the voltage applied between the inter-digitated teeth. The voltage applied between the inter-digitated teeth launches the surface wave on the material which moves across the material and the wave travels to the receiving set of inter-digitated teeth where it develops a voltage across that set of inter-digitated teeth. When more than two sets of inter-digitated teeth are used, one can be used to excite a surface wave which travels to the second set of inter-digitated teeth which modulates the signal which modulated signal can then be received by the third set of inter-digitated teeth.

What is needed, and has not heretofore been developed, is a method and apparatus for increasing the frequency of a surface wave from the megahertz range to the terahertz range while reducing the scale of the surface wave to a single electron layer. The applications of such a device would include a source of Terahertz radiation for Terahertz frequency range spectroscopy, signal processing and sensing.

Much attention has been focused on the collective excitation spectrum of low-dimensional semiconductor systems. Interest has been driven both by the search for novel behavior from bulk semiconductor systems, and by the challenge to fabricate and probe devices based on these low-dimensional structures. Collective excitations have been studied extensively both experimentally and theoretically, using linearized hydrodynamic models and quantum many-body formulations. The results from these models yield similar behavior in the $\omega,k$ regime, where $k<k_F$, the Fermi wave vector. Thusfar in the literature, there has been no treatment of the non-linear behavior of these collective excitations in low-dimensional systems. Furthermore, the non-linear regime has not been experimentally accessible due to the weak coupling schemes used for excitation, including prism and grating couplers.

Previous efforts in this area are as follows:

U.S. Pat. No. 5,612,233 to Rosner, et al., discloses a method of manufacturing a single electron component in silicon MOS technique with at least two gate levels. The first gate level is made up of fine layers having dimensions <100 nanometers with the surface and side walls of the gate level provided with an insulating layer. The second gate level covers the fine components of the first gate level in at least the region of the active zone. The location and dimensions of nodes or potential barriers of the single electron component are defined by the fine structures of the first gate level.

U.S. Pat. No. 5,485,018 to Ogawa, et al., discloses a logic device on the nanometer scale providing multiple logic levels made up of asymmetrically coupled quantum point contacts and a coupling region between gate electrodes. The quantum mechanical carrier wave function within the region is a spatially asymmetric wave. By changing the energy level, the conductance of the device can be switched between multiple stable conductance levels. The device can be utilized to provide a multi-level output switched in response to terahertz pulses provided by an array of optical detectors.

U.S. Pat. No. 5,291,034 to Allam et al., discloses a nonlinear optical device which employs a GaAs, AlGaAs well configuration which laterally confines a two-dimensional electron gas to produce laterally asymmetric quantum dot structures which can be controlled by bias potentials applied to alter the lateral extent of the well. This controls the assymetry of the well and affects the non-linear optical characteristic in response to incident radiation.

U.S. Pat. No. 5,239,517, to Mariani, discloses a coplanar wave guide wherein the ground planes taper directly into the outer bus bars of the SAW transducer and the center conductor of the coplanar waveguide feeds directly to the "hot" center electrode structure of the SAW transducer.

U.S. Pat. No. 5,105,232 to del Alamo, et al., discloses a quantum field effect directional coupler. The device is comprised of two quantum waveguides closely spaced apart. An adjacent gate electrode is provided over the space between the waveguides. The probability density between the wave guides is controlled by a voltage applied to the gate electrode, which controls coherent electron tunneling between wave guides. The design allows for several couplers to be connected in order to perform multi-tasking operations.

U.S. Pat. No. 5,067,788 to Jannson, et al., discloses a high speed surface plasmon wave modulator. The modulator employs a polymer glass material and super fast electro-optic controlling medium for modulating laser light at ultra high frequencies. The modulator may be configured in a planar format by complying a guided light wave with a surface plasmon wave generated at the interface of a metal electrode and an electro-optic material.

U.S. Pat. No. 4,783,427 to Reed, et al., discloses a process for the fabrication of quantum well devices, where the quantum-wells are configured as small islands of GaAs in AlGaAs matrices. The dimensions of such well devices are on the nanometer scale. These wells are fabricated by growing an n– on n+ epitaxial GaAs structure, which is then etched to an e-beam defined pattern twice, and AlGaAs is epitaxially regrown each time.

U.S. Pat. No. 4,581,621 to Reed discloses quantum-coupled devices where there are at least two closely situated well devices. The bias between the two closely situated wells can be adjusted in order to align the energy levels of the two wells so that tunneling will occur very rapidly, on the angstrom scale. Whereas conversely, when energy levels are not aligned, tunneling will be greatly reduced. The invention further provides for the output from these quantum well devices to be coupled to macroscopic contacts.

U.S. Pat. No. 4,205,329 to Dingle, et al., discloses a technique for the synthesis of single crystal super lattices of semiconductor alloys, particularly with the fabrication of periodic structures of GaAs and AlAs. The patent further describes possible uses of the invention for waveguides, heterostructure lasers and x-ray reflectors.

None of these efforts, taken either alone or in combination, teach or suggest all of the elements of the present invention, nor disclose all of the benefits thereof.

OBJECTS AND SUMMARY OF THE INVENTION

It is a primary object of the present invention to provide a method and apparatus for the generation, manipulation, and detection of plasmons in semi-conductor heterostructures.

It is another object of the present invention to launch an electron wave to create a signal which can be read by a receiver.

It is an additional object of the present invention to provide a plasma wave that can be modulated between the launching and receiving thereof.

It is an additional object of the present invention to provide a device that can allow for the propagation of a plasmon by creating a structure comprising a two-dimensional electron gas well formed between the interface of a high bandgap semiconductor such as AlGaAs, and a lower bandgap semiconductor such as GaAs.

It is an additional object of the present invention to provide a medium for the transport amplification and processing of signals at high frequencies.

It is still an additional object of the present invention to provide a medium for transport amplification and processing of signals in the terahertz frequency range.

It is an additional object of the present invention to provide a device where a plasmon is created by pulsing a current through a conductor placed in close proximity to a two-dimensional electron gas well.

It is an additional object of the present invention to provide a receiver for a plasmon signal wherein the plasmon wave induces an electric signal in the receiver.

It is an additional object of the present invention to utilize a photoconductive switch to create a pulse in a conductor to induce a plasmon.

It is an additional object of the present invention wherein the photoconductive switch can be illuminated by a laser on a pico or sub-pico second basis to create a pulse to create a plasmon.

It is an additional object of the present invention to modulate a plasmon wave it travels in a two-dimensional electron gas well.

The present invention relates to a method and apparatus for the generation, manipulation and detection of plasmons, and/or solitons, both linear and non-linear, in semi-conductor heterostructures. The apparatus includes a heterostructure such as a Galium Arsonide (GaAs) substrate, a two-dimensional electron gas (2-DEG) well formed thereon and a thin layer of Aluminum Galium Arsonide (AlGaAs) placed thereover. Alternatively, GaAs could be used as a substrate and a higher bandgap material such as AlGa as could be used as the thin layer. Launcher and receiver lines are formed on the AlGaAs layer. Each of the launcher and receiver lines includes a coplanar transmission line such as coplanar wave guides which preferably consist of two to three metal lines. One line is interconnected with a photoconductive switch and can be pulsed The other line or lines are grounded. Pulsing the line forms an electric field that creates an electron wave or plasmon in the 2-DEG. This wave propagates to the receiver which includes two or more lines in which the plasmons induce an electric field which can be detected. Between the launcher and the receiver, the plasmon can be modulated by one or more additional gate lines extending over the 2-DEG.

BRIEF DESCRIPTION OF THE DRAWINGS

Other important objects and features of the invention will be apparent from the following Detailed Description of the Invention taken in connection with that accompanying drawings in which.

DETAILED DESCRIPTION OF THE INVENTION

The present invention relates to a device technology based on the generation, manipulation, and detection of plasmons, and/or solitons, both in the linear and non-linear regime, in semiconductor heterostructures. A plasmon is a collective, longitudinal charge density wave. A solution is a wave form that can propogate without dispersing, i.e. without changing shape over long distances. These solitons, as well as the plasmons, can be exploited as a medium for signal transport, amplification, and processing.

Plasmons have frequencies, determined by the charge carrier density, which lie in the far-infrared (FIR) sub-millimeter range and can be tuned electrically by applying a bias voltage to an overlaid gate. The frequencies of the plasmons disperse over a wide range with wave-vector. For a 2-D electron gas, the dispersion relation is given by:

$$\omega(k) = \frac{n_s e^2}{2m^* \varepsilon_0 \varepsilon_r} k$$

where ω is the plasmon frequency (in the absence of any spatial modulation of the 2-DEG density), k is the wave-vector in the plane of the 2D system, $n_s$ is the areal density of the carriers of charge e and effective mass m, and $\varepsilon_r$ is the effective dielectric function for the system, which depends on the thicknesses and the dielectric properties around the 2D charge sheet. These 2-D plasmons have been observed in AlGaAs/GaAs heterostructures, where the electrons are confined in a very narrow potential well at the interface between the AlGaAs and GaAs layers, forming the 2-DEG. Furthermore, 1-D plasmons have also been observed, where additional confinement of the electrons is produced in a $2^{nd}$ direction by a Schottky gate.

Figure 1:
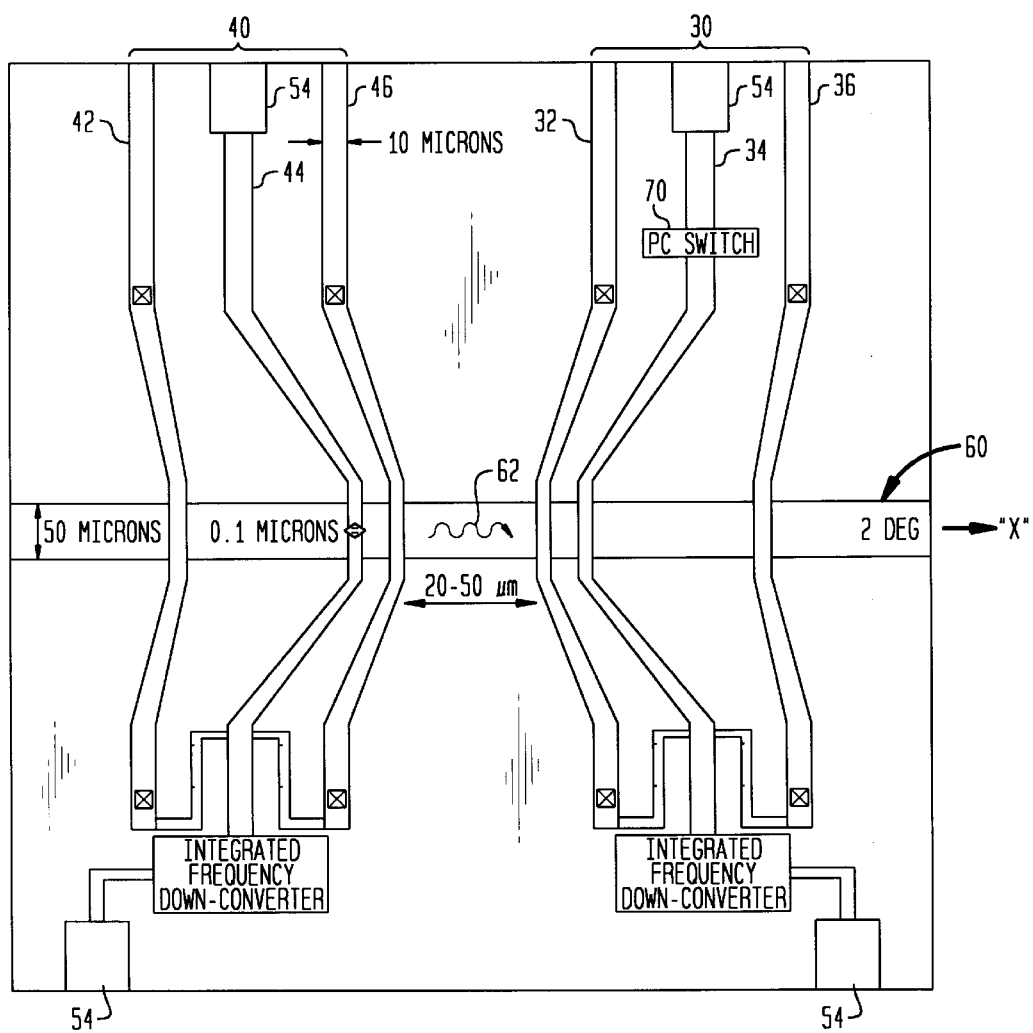
FIG. 1 is a top schematic view of an apparatus of the present invention for generating and detecting plasmons in semi-conductor heterostructures.

Direct coupling between EM radiation and plasmons is not possible because the plasmon wavelength is always longer than that of freely propagating EM radiation of the same frequency. Therefore, a coupling structure is needed such as a prism coupler or an overlaid metal grating, such as that shown in FIG. 1. Referring to FIG. 1, a top schematic view of a chip generally indicated at 20, having a launcher and a receiving coupling structure, is shown. The launcher 30 and receiver 40 comprise coplanar wave guides formed of overlaid metal grating, each consisting of three lines 32, 34, and 36, and 42, 44, and 46 respectively. Importantly, any appropriate transmitter, such as a coplanar transmission line can be used for the launcher and receiver structure. Air bridges 50 are formed on ground lines 32 and 36 and 42 and 46 to tie them to the same potential. Each line is approximately 0.1 microns wide and located about 1 micron apart. Other coupling structures are considered within the scope of the invention. It should be noted that one such suitable structure would comprise two coplanar gates. However, three gates provides for greater accuracy and maintains the integrity of the signal. The launcher 30 launches the wave and the receiver 40 receives the wave. The carriers of the wave are electrons.

The wave travels across the chip, generally indicated at 20 through a well 60 comprising a thin electron layer, e.g. a 2-dimensional electron gas (2-DEG). The well 60 is formed on a heterostructure such as Galium Arsonide (GaAs) substrate, with a thin layer of Aluminum Galium Arsonide (AlGaAs), about 500 angstroms, placed over the well. This can be seen in FIG. 7, which shows a GaAs substrate 22 has a layer of AlGaAs layer 24 thereon forming a well 60 therebetween wherein the 2-DEG resides. Other heterostructures such as GaAs based, as well as non-GaAs based heterostructures can be used. For example, a GaAs/InGaAs heterostructure can be used. Importantly, the well 60 is positioned between the interface of a high bandgap material and a low bandgap material. Either the high or low bandgap material can serve as the substrate, the other serving as the thin upper layer.

The launcher 30 comprising lines 32, 34, and 36 are on the upper layer and it stimulates the electron layer. When a signal is applied to the launcher 30, as will hereinafter be described, it excites a compressional wave in the electron layer which modulates the electron density. So instead of a riple under surface like a SAW device, this is just a change in the electron density. The receiver 40, comprising gate lines 42, 44, and 46, picks up and reads the signal. A third set of lines can be used to modulate the signal. Basically this scheme allows for what was done with SAW technology, but at much higher frequencies, such as in the terahertz (Thz) range.

Figure 3:
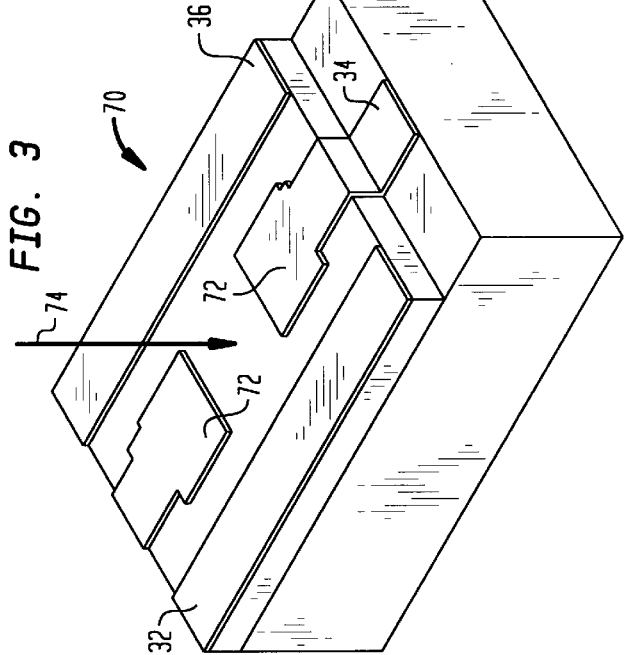
FIG. 3 is a perspective view of the photoconductive switch shown in FIG. 1.

A switch, such as a photoconductive switch 70 is used to create a pulse in line 34 to excite the 2-DEG. Referring to FIG. 3, an enlarged perspective view of such a photoconductive switch 70 is shown. The photoconductive switch 70 is essentially an optoelectronic device, that can be illuminated by a laser on a pico or sub-pico second basis. The device includes Ohmic contacts 72. The center conductor 34 is biased to some potential with respect to the two outer ground conductors 32 and 36 positioned on either side of the center conductor 34. As a result of the laser 74 illuminating the switch 70, the switch 70 is closed over a few pico seconds and an electromagnetic transient or pulse propagating down the line 34 is created. The pulse excites the electrons in the 2-DEG and a plasmon or wave, generally indicated at 62 in FIG. 1, is created. The plasmon 62 travels from the launcher 30 to the receiver 40 where the signal can be received. Pads 54 at the ends of the lines 34 and 44 are used to interface the chip 20 to the outside world. The signals are so fast that, they have to be sampled to determine the voltage which is output to the pad 54.

Figure 4:
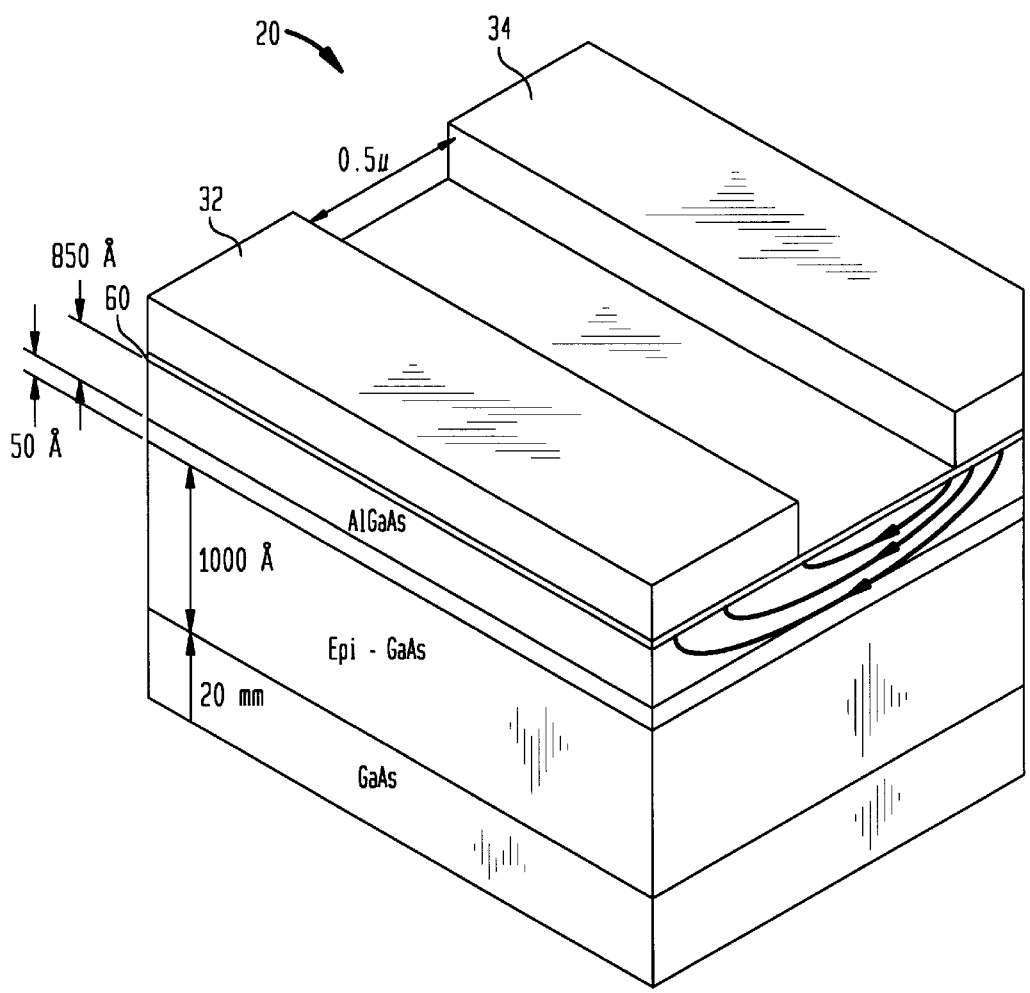
FIG. 4 is a perspective view of the device shown in FIG. 3 which shows the electric field created when the photoconductive switch is pulsed.

Referring to FIG. 4, input bars 32 and 34 are shown positioned on GaAs. When electric line 34 is pulsed, a longitudinal electric field is created based on electric field lines extending from the pulse line 34 to the ground line 32. The strong electric field charge that is created operates in the well 60 to excite the electrons and create a plasma wave. The electrons are free to propagate along the well 60, and do so until they reach the receiver 40, which is positioned about 20 to 50 microns away from the launcher 30.

The receiver 40 operates in the same way as the launcher 30 in that the receiver detects electromagnetic pull caused by the plasma waves which biases the conducting lines of the receiver 40 as the wave 62 pass underneath the receiver 40. The signal can then be processed by a detection circuit or an oscilloscope or some other device.

Figure 2:
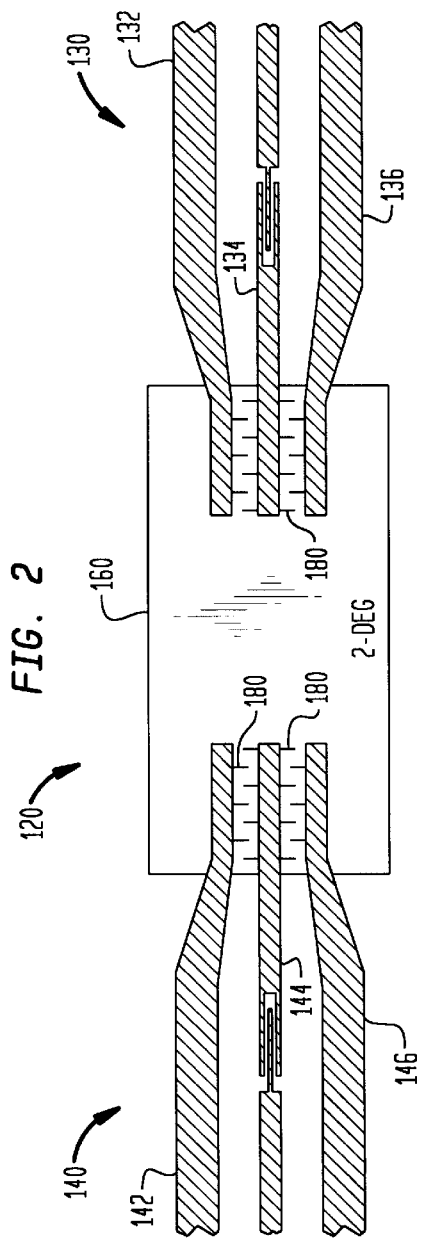
FIG. 2 is a top schematic view of another embodiment of the apparatus shown in FIG. 1.
Figure 5A:
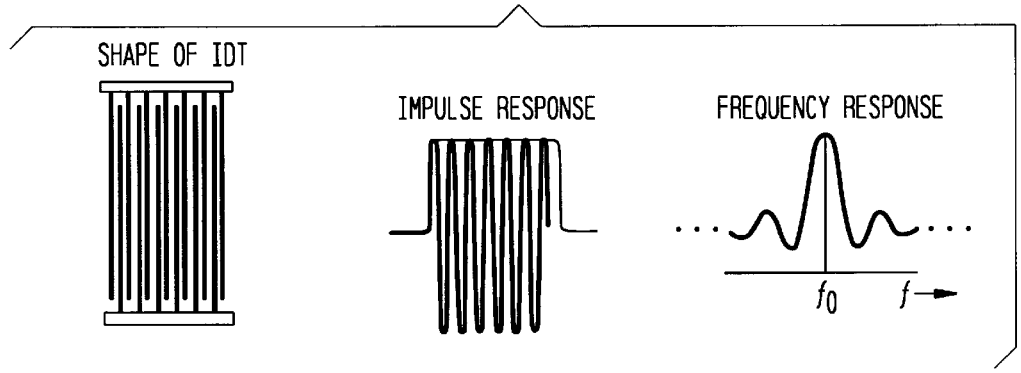
FIGS. 5a and 5b show the wave forms that can be created by the devices of FIG. 1 and FIG. 2 respectively.
Figure 5B:
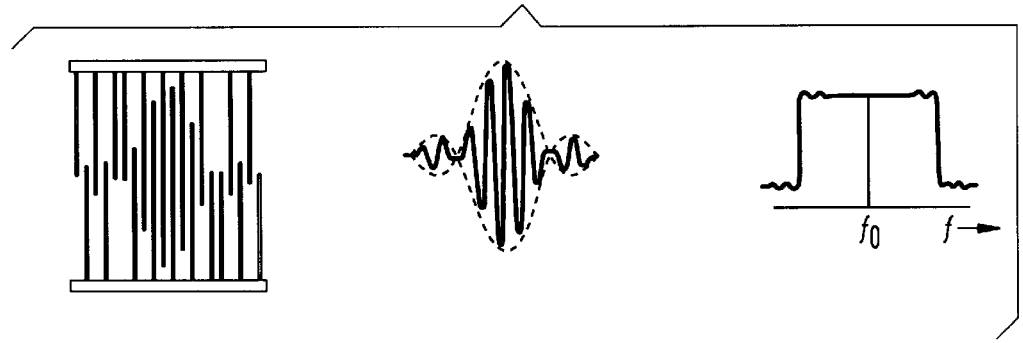

Referring now to FIG. 2, an alternate embodiment of the device shown in FIG. 1 is shown schematically. In this Figure, like reference numerals refer to like elements. Basically, the device generally indicated at 120 includes a 2-DEG well 160. The launcher 130 includes lines 132, 134, and 136, lines 132 and 136 being ground lines. Line 134 is interconnected with a photoconductive switch (not shown). Likewise, the receiver generally indicated at 140, includes lines 142, 144, and 146, lines 142 and 146 being ground and line 144 interconnected with a photoconducting switch (not shown). Fingers 180 extend away from the lines 132, 134, 136 and 142, 144 and 146 perpendicularly therefrom. It is these fingers 180 that create the pulsed electric field. By applying various schemes to the transducer geometry, the impulse response of the transducer and the type of wave that can be generated can be varied as shown in FIGS. 5a and 5b. FIG. 6b shows an apodization scheme imposed on the wave created by the overlap between the fingers 180 which allows for variation of the frequency in bandwidth of the surface wave so that much more complex wave forms carrying more information can be generated.

Figure 6:
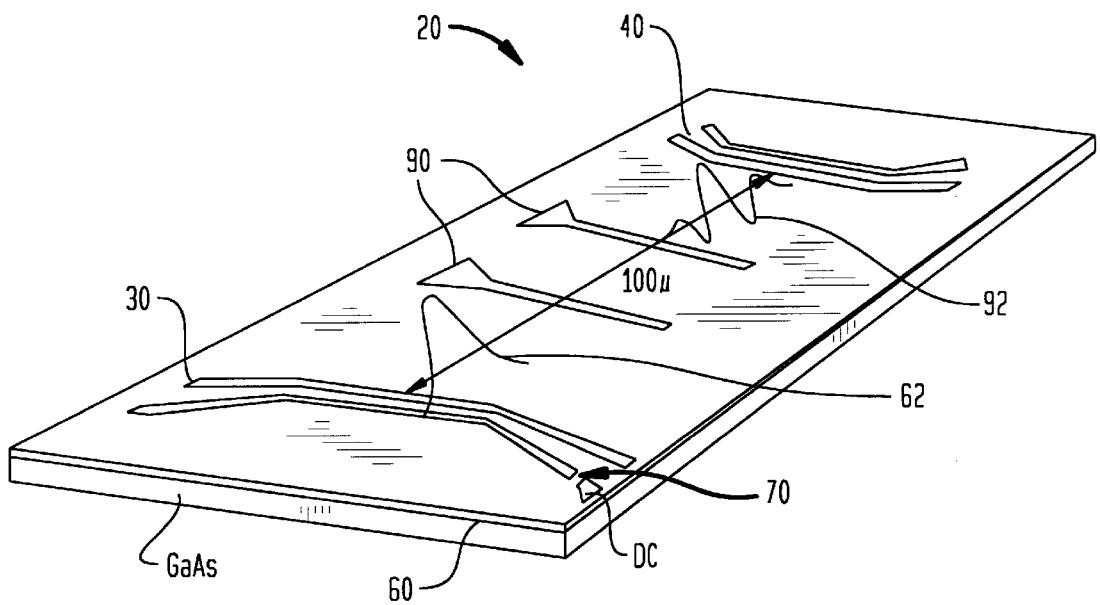
FIG. 6 is a perspective view of another embodiment of the device shown in FIG. 1 which device includes modulating gates positioned between the launcher and receiver.
Figure 7:
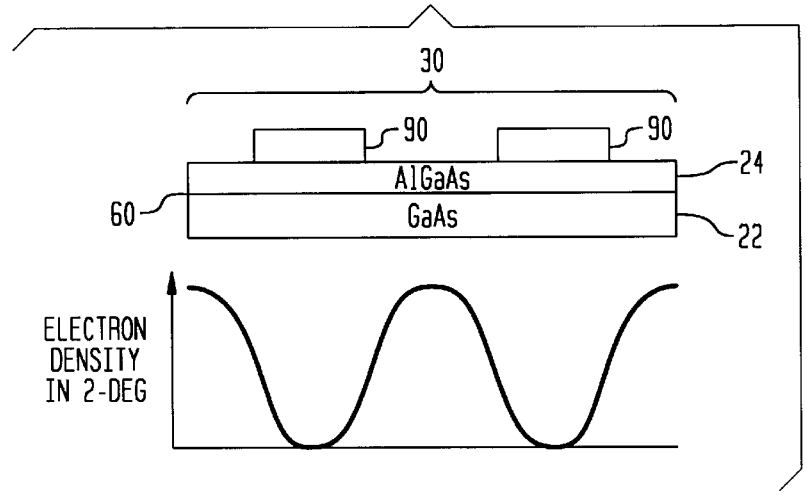
FIG. 7 is a cross-sectional view depicting the electron density modulation under a pair of biased gates.

Referring to FIG. 6, it can be seen that a plasma wave 62 is created by a launcher 30 which creates a plasmon in the 2-DEG which propagates towards the receiver 40. This plasmon can be modulated by modulating strip lines or gates 90 to created a modulated plasmon 92 which is received by the receiver 40. The modulating gates 90 modulate the average electron density. As shown in FIG. 7, the gates 90 are positioned over upper layer 24 which is placed over substrate 22 forming a 2-DEG well 60 therebetween. This spatial modulation leads to modifications in the resonances. According to how many gates are applied and the biasing scheme, the plasmon frequency is shifted higher or lower than the frequency in the absence of spatial modulation. These shifts in plasmon frequency can be measured and observed and can be exploited for device application. Typical sizes of metallic fingers are about 0.5 to 0.7 microns with separations about 0.2–0.4 microns. The frequency response of the system depends upon the electron density. Therefore, by applying modulating gates 90 with biases along the propagation path the properties of the gas can be altered which alters the property of the plasmon.

The metal fingers 180 of the grating spatially modulate the EM field of the normally incident radiation, generating spatial harmonics of the longitudinal (z) component of the electric field of wave-vector $k_z = 2\pi n/d = nG$ in the plane of the 2-DEG. Here, d is the period of the grating, G is the fundamental grating wave-vector, and n takes both positive and negative integer values. The grating period is much smaller than the wavelength of the radiation and consequently only the zeroth spatial harmonic of the field, $E_z^{nG}=$ $E_z^0$ propagates and all higher orders are evanescent. The plasmon oscillation of spatial frequency mG and temporal frequency $\omega^{mG}$ is driven by the evanescent field $E_z^{nG}$ with n=m.

The effective dielectric function $\epsilon_r$ used above includes the screening effect of the metal grating and the other semiconductor layers adjacent to the 2-DEG. For a standard AlGaAs/GaAs heterostructure, $\epsilon_r$ is known to be:

$$\epsilon_r = \tfrac{1}{2}(\epsilon_{GaAs} + \epsilon_{AlGaAs}{}^{tanh(kh)})$$

where h is the distance between the 2-DEG and the top surface.

The grating introduces a lateral modulation of the conductivity close to the 2-DEG but is not an efficient coupling mechanism. Pulsed excitation of the 2-DEG is used to achieve strong coupling to plasmons. Strong coupling occurs because of the strong lateral component of the electric field propagating along the coplanar transmission line. The generation of high-amplitude plasma oscillations leads to the formation of solitons. These solitons are of special interest as a source of THz radiation and for device application.

The devices of the present invention allow for exploiting plasmons in the linear regime for device application as well as for exploiting the nonlinear plasmons, or solitons, for applications in other areas. Solitons are natural carriers of binary information because (a) they can propagate long distances with changing shape (in a 2-DEG long means about 20 microns) (b) they can interact with each other without changing their shape or velocity (unlike linear waves), and (c) they exhibit a threshold energy, below which they disperse and above which they become self-contained. So again, by biasing metal fingers along the propagation path, the average density is modulated and hence the spectral composition of the solution is modulated. When the average density is low enough (for sufficient positive bias to the gates), a solution will not be able to propagate. This is a source of "1"'s and "0"'s in the system. Thus, the devices of the present invention have potential application as digital logic gates. The nature of solution propagation provides a natural thresholding operation—a pulse can only propagate as a solution if it contains at least the solution critical energy (which depends on the average electron density), otherwise it rapidly disperses. This digital nature of solution propagation makes solitons natural carriers of binary information.

With respect to the replication of SAW technology using plasma waves in place of Rayleigh waves, for SAW's and plasmons, the frequency launched is the same as the frequency of the applied EM signal. However, the wavelengths for the SAW's and plasmons are much smaller than for the applied EM signal. For example, for f=1 GHz, $$\lambda_{EM} = \frac{3 \times 10^{10} \text{cm/s}}{10^9 1/s} = 30 \text{ cm}$$

$$\lambda_{plasmon} = \frac{10^7 \text{ cm/s}}{10^9 1/s} = 0.1 \text{ cm} = 100 \text{ microns}$$

$$\lambda_{Acoustic} = \frac{10^5 \text{ cm/s}}{10^9 1/s} = .0001 \text{ cm} = 1 \text{ micron}$$

So when an applied EM signal reaches a SAW based or plasmon based device, the "brakes are applied" and the signal is slowed down. This is useful for delay line purposes. Similarly, the grating coupler and grating detector can be employed in the same way as the SAW transducer. The width of each finger of the transducer and the separation between the fingers determine the amount of the delay.

Similarly, the filtering capabilities of the SAW devices can be reproduced in the sub-millimeter range exploiting the plasmons. The finger-pair overlap of the inter-digitated fingers determines the filtering characteristics. By applying a transducer-like structure as a load on a co-planar transmission line, the filtering and delay characteristics of SAW devices can be reproduced exploiting the plasma-waves instead of the Rayleigh waves. The frequency components needed to couple to the plasma waves can be produced via a photo-conducting switch fabricated on the co-planar transmission lines such that when a pico or sub-pico second pulse produced by the laser closes the switch, an EM pulse of corresponding width (containing frequency components extending into the THz regime) is launched and propagates along the co-planar transmission line toward the transducer load.

Surface wave filters are implemented via the repeated delaying and sampling on an input signal and are thereby classified as transversal filters. The ID (interdigitated) transducer response is limited to a bandwidth that is determined by the range of electrode spacings. Moreover, the electrode-pairs function as taps which sample the propagating plasmon. By apodizing the transducer electrodes, meaning varying the overlap length of the electrodes, the filter response can be adjusted. Furthermore, the device can be exploited as plasma wave convolvors/correlators that operate with the same principles as SAW convolvers/correlators.

Mathematical Model

A new class of localized excitations to form part of the non-linear mode spectrum of the 2-DEG have been found. These are stable, pulse-like waveforms that propagate with constant velocity and profile. In addition, these solitary excitations exhibit the properties of solitons in that they retain their shape and velocity in a collision. For typical 2-DEG electron densities on the order of $10^{12}$ cm$^{-2}$, the characteristic frequency of oscillation of the electron gas, $\omega_p$, extends into the THz regime; consequently, these solitons are of special interest as a source of THz radiation and for device application.

These excitations are shown to be described by a nonlinear equation of evolution in space which is suitable for the analysis of experiments in which the generation and detection of the excitations occur at two different spatial locations. For this purpose, a matrix formulation of the model system of equations is used, which permits the extraction of the desired equations of evolution.

For the system under consideration, the interface in which electron motion is free will be considered as the y-z plane, while the x-axis will denote the direction perpendicular to this plane for which electron motion is confined. For simplicity, it is assumed that the wave function is exactly confined in the plane of the interface (y-z plane), with no extension outside of the plane; therefore, this model provides a good description of non-linear excitations at low temperature, where only one subband is occupied.

The dynamics of the electron gas are described via a hydrodynamic model, with the electrons possessing an isotropic mass and the ions assuming the form of a compensating uniform background. The variables that comprise the hydrodynamic model are: the electron density n(r,t) and the current density J(r,t). The electron density consists of contributions from a time-independent background $n_0$ and time-dependent $n_1(r,t)$; i.e., $n(r,t) = n_0 + n_1(r,t)$ where $n_1(r,t) < n_0$. For charges confined to a single layer (the y-z plane), these variables can be expressed as $n(r,t) = n(z,t)\delta(x)$ and $J(r,t) = J_z(z,t)\delta(x)\hat{z}$, where $\hat{z}$ is a unit vector in the plane of the 2-DEG and, for simplicity, variations in the y-direction are neglected.

These variables satisfy the continuity equation and the Euler equation of motion, namely:

$$\partial_t(-en(r,t)) + \Delta \cdot J(r,t) = 0 \quad (1)$$

$$\partial_t J(r,t) - \frac{1}{en_0} \nabla \cdot (J(r,t)J(r,t)) = \frac{e^2}{m} n(r,t)E(r,t) + e\beta^2 \nabla n(r,t) - \frac{1}{\tau} J(r,t) \quad (2)$$

Retardation effects are included in that the field variables, E(r,t) and B(r,t) obey the full Maxwell's equations. β is the spatial dispersion parameter with units of speed, and τ is the momentum relaxation time; both parameters are assumed to be velocity independent. As a result, this formulation does not include microscopic phenomena (such as exchange, correlation effects, and wave-particle interactions); however, it sufficiently describes the non-linear plasmon-polariton excitations in the k<$k_F$ regime. Furthermore, the formulation presented below can be extended to include a more complete description of the electron gas.

The non-linear effects arising from the $\Delta \cdot (J(r,t)J(r,t))$ and n(r,t)E(r,t) terms in equation (2) are due to the fact that elements of the 2-DEG with different average current tend to compress, and the force driving a change in the average current density of the 2-DEG element depends on the local density, respectively. Thusfar in the literature where the hydrodynamic model has been applied to 1-D and 2-D systems, eqn. (2) is linearized for the purpose of obtaining the linear plasmon spectrum.

For our purposes, Maxwell's equations are expressed through the vector potential A(r,t) in the gauge where the scalar potential vanishes. In this gauge, the vector potential is related to the electric and magnetic fields such that $E(r,t) = -\partial_t A(r,t)$ and $B(r,t) = \Delta \times A(r,t)$, and satisfies the wave equation $$[\nabla^2 - \mu_0 \varepsilon \partial_t^2] A(r,t) = -\mu_0 J(r,t)\tilde{z} - \frac{e}{i\omega\varepsilon} \partial_z n(r,t)\tilde{z} \quad (3)$$

The system of equations (1)–(3) forms the basis for the investigations of the non-linear excitations.

The approach for deriving the equation of evolution in space for these excitations is as follows: (a) cast the model equations into a matrix formulation; (b) transform the coupled system of equations into the frequency domain in order to isolate the plasmon excitations; and (c) inverse transform back into the time domain. This approach permits the analysis of non-linear excitations which initially contain a wide spectrum of frequencies (such as pulse excitations).

To this end, the gradient operator is decomposed as $\Delta = \Delta_t + \partial_z \tilde{z}$, where $\Delta_t$ is the part of the gradient operator transverse to the propagation direction (the z-direction) of the excitations. The system of equations (1)–(3) is then transformed into the frequency domain and cast in matrix form as a non-linear equation of evolution along the z-direction:

$$\Gamma \partial_z^2 \psi(r,\omega) + L(\Delta_t,\omega)\psi(r,\omega) = NL[\psi(r,\omega)] \quad (4)$$

where the linear operator $L(\Delta_t,\omega)$ consists of a lossless, Hermitian operator $L_0 = L_{\tau=\infty}$ and a smaller, perturbative term $L_{coll}$ (such that $L = L_0 + L_{coll}$ and $L_0 \gg L_{coll}$):

$$L_0(\nabla_t,\omega) = \begin{bmatrix} \frac{\omega_p^2}{c}\{(\partial_x^2 + \omega^2\mu_0\varepsilon)\tilde{z}\tilde{z} - \partial_x\tilde{z}\tilde{z}\} + \omega^2\mu_0\varepsilon\tilde{x}\tilde{x} & \mu_0\delta(x)\tilde{z}\tilde{z} \\ \mu_0\delta(x)\tilde{z}\tilde{z} & \delta(x)\left(\frac{\mu_0 mc}{e^2 n_0}\right)^2\left[\tilde{z}\tilde{z} - \frac{e^2\beta^2}{\kappa_z^2}\tilde{x}\tilde{x}\right] \end{bmatrix}$$

$$L_{coll} = \begin{bmatrix} 0 & 0 \\ 0 & \delta(x)\frac{\mu_0 mc}{e^2 n_0 \omega_p} \frac{i}{\tau\omega}\tilde{z}\tilde{z} \end{bmatrix} \quad \psi(r,\omega) = \begin{bmatrix} A_z(x,z,\omega)\tilde{z} + \partial_z A_x(x,z,\omega)\tilde{x} \\ \frac{e^2 n_0}{\mu_0 mc^2}(J_z(z,\omega)\tilde{z} + i\partial_z n(z,\omega)\tilde{x}) \end{bmatrix}$$

$$\Gamma = \begin{bmatrix} -(\partial_x \tilde{x}\tilde{z} - \tilde{x}\tilde{x}) & 0 \\ 0 & \delta(x)c\frac{\mu_0 m\beta^2}{e^2 n_0}\left(\frac{1}{e\omega}\tilde{z}\tilde{z} + \frac{1}{\kappa_z^2}\tilde{x}\tilde{z}\right) \end{bmatrix} \quad \text{and}$$

$$NL = -\frac{\mu_0 m}{e^2 n_0 \omega}\delta(x)\tilde{z}\begin{bmatrix} 0 \\ \int\int d\omega_1 d\omega_2 \delta(\omega - \omega_1 - \omega_2)\left\{\frac{2}{en_0}J_{3\nu_1} - \frac{e}{m}\frac{\omega_1}{\omega_2}A_{3\nu_1}\right\}\partial_z J_{3\nu_2} \end{bmatrix}$$

To obtain this form, the vector potential and the wave equation (3) have been written in component form. To simplify the analysis, the dielectric constant, ε, will be used to characterize both the AlGaAs and GaAs surrounding the 2-DEG.

Solutions to (4) are sought in the form of an expansion in terms of the eigenfunctions of the operator, $L_0$, namely $$\Psi(r,\omega) = \sum_\alpha \Phi_\alpha(x,\omega) a_\alpha(z,\omega) \quad (5)$$

where $\Phi_\alpha(x,\omega)$ are the eigenfunctions of $L_0$ defined as $$L_0(-i\omega,\partial_x)\Phi_\alpha(x,\omega) = \kappa_{z\alpha}^2(\omega)\Gamma\Phi_\alpha(x,\omega) \quad (6)$$

The eigenfunctions $\Phi_\alpha(x,\omega)$ possess the orthonormality property $(\Phi_\alpha(x,\omega), \Gamma\Phi_\beta(x,\omega)) = 2\delta_{\alpha\beta}$ in the x-direction. Equation (6) is solved by obtaining expressions for the regions x>0 and x<0 and satisfying boundary conditions. The two boundary conditions are found from the continuity of the tangential component of the vector potential and from the integration of equation (6) about x=0. The solutions have the form:

$$\Phi_\alpha(x, w) = \begin{bmatrix} \dfrac{-i\omega m}{e^2 n_0}\left(1 - \dfrac{\beta^2 \kappa_{z\alpha}^2}{\omega^2}\right) e^{-|\kappa_{z\alpha}|x}\left(\hat{z} \mp \dfrac{\kappa_{z\alpha}^2}{|\kappa_x|}\hat{x}\right) \\ (i\omega)\left(\hat{z} - \dfrac{\kappa_{z\alpha}^2}{e\omega}\hat{x}\right) \end{bmatrix} \quad (7)$$

where c is the speed of light in the medium;

$$|\kappa_{x\alpha}| = \sqrt{\kappa_{z\alpha}^2 - \omega^2/c^2}$$

is the transverse wave number, and the top (bottom) sign is for solutions x>0 (x<0).

The boundary conditions yield the well known dispersion relation for linear 2-D plasmons, namely, $$\omega^2 = \beta^2 \kappa_{z\alpha}^2 + \omega_p c \sqrt{\kappa_{z\alpha}^2 - \dfrac{\omega^2}{c^2}} \quad (8)$$

where $$\omega_p = \dfrac{n_0 e^2}{2\varepsilon mc}$$

is the 2-D plasma frequency. At very low frequencies, $\omega \ll \omega_p$, the transverse wave number $|\kappa_x| \to 0$ and the dispersion relation tends to $\omega \approx c\kappa_z$; hence, the mode structure contained in equation (7) becomes electromagnetic-like in that the longitudinal component of the wave vector $A_z \to 0$. At the other extreme, where $$\omega \gg \dfrac{\omega_p}{\beta/c},$$

the excitations also approach a non-dispersive wave, traveling at the thermal speed with dispersion relation $\omega \approx \beta \kappa_z$. Plasmon behavior dominates in this limit, characterized by the transverse component of the wave vector $A_x \to 0$. In the region between these two extremes, the excitations are mixed and dispersive, due to the non-negligible contributions of both the transverse and longitudinal field components to the mode structure.

At low temperatures and for a 2-DEG of infinitesimal thickness, the electrons occupy one sub-band. In this case, there exists only one mode of propagation, i.e. $\alpha$ takes on only one value so that $\Phi_\alpha(x,\omega) \equiv \Phi(x,\omega)$.

Employing the eigenfunctions, equation (7), their orthogonality property, and the expansion in eqn. (5), the equation for the modal amplitude $a_\alpha(z,\omega) \equiv a(z,\omega)$ in the frequency domain follows from eqn. (4):

$$\partial_z^2 a(z,\omega) = -\kappa_z^2(\omega) a(z,\omega) - \dfrac{i\omega}{2\tau c^2} a(z,\omega) + \quad (9)$$

$$\dfrac{1}{2en_0 c^2} \int\int d\omega_1 d\omega_2 \delta(\omega - \omega_1 -$$

$$\omega_2)(\omega_1\omega_2)\left\{2 + \dfrac{\omega_1}{\omega_2}\left(1 - \dfrac{\beta^2 \kappa_z^2(\omega_1)}{\omega_1^2}\right)\right\} a(\omega_1)\partial_z a(\omega_2)$$

Attention is focused on non-linear pulse excitations in the plasmon-polariton regime with bandwidth $\omega < (\omega_p c/\beta)$, where retardation is significant and the effects of spatial dispersion are weak. In this regime, the dispersion relation, equation (8), can be approximated as $$\kappa_z^2 \approx \dfrac{\omega^2}{c^2}\left(1 + \dfrac{\omega^2}{\omega_p^2}\left(1 - \dfrac{\beta^2}{c^2}\right)^2\right).$$

Using this approximation in equation (9) and inverse transforming in time yields a non-linear equation in space-time of the form:

$$\partial_z^2 a(z,t) = \partial_t^2 a(z,t) - K^2 \partial_t^4 a(z,t) + \dfrac{1}{2\tau\omega_p}\partial_t a(z,t) + \quad (10)$$

$$\left\{\dfrac{1}{2}\partial_t^2 \partial_z(a^2(z,t)) - a(z,t)\partial_t^2 \partial_z a(z,t) + \right.$$

$$\left. K^2 \partial_t^2 a(z,t)\partial_z a(z,t) + K^2 \dfrac{\beta^2}{c^2}\partial_t^4 a(z,t)\partial_z a(z,t)\right\}$$

where $$K = 1 - \dfrac{\beta^2}{c^2};$$

t and z have been normalized such that $t \to \omega_p t$ and $$z \to z\dfrac{\omega_p}{c};$$

and the excitation amplitude a(z,t) has been normalized such that $$a(z,t) \to \dfrac{\omega_p}{2en_0 c} a(z,t).$$

This is a non-linear, dispersive equation which is second order in space, implying solutions that propagate in the +z and −z directions. In search of the nature of the solution, the damping term on the right hand side of equation (10) in the limit $\tau \to \infty$ is considered and later the scale of the dynamics with $\tau$ is compared.

Using the reductive perturbation method, the non-linear evolution equation (10) can be shown to belong to a class of nonlinear evolution equations which admits a reduction to the well-known Kortweg-de-Vries (KdV) equation. Introducing a small parameter, $\epsilon \ll 1$, and expressing the amplitude a(z,t) in a perturbation series, $$a = \sum_{n=0} a_n \epsilon^n,$$

the following change of variables is introduced:

$Z = \epsilon^3 z$ $T = \epsilon^{1/2}(z-t)$

Substituting these relations into equation (10) and integrating once with respect to time, we find to lowest order in $\epsilon$:

$$\partial_Z \hat{a}(Z,T) + K^2 \partial_T^3 \hat{a}(Z,T) - (1+K/2)\hat{a}(Z,T)\partial_T \hat{a}(Z,T) e^{-Z/\omega_p \tau} = 0 \quad (11)$$

where $a_1(Z,T) = \hat{a}(Z,T)e^{-Z/\omega_p \tau}$. In the limit $\tau \to \infty$, equation (11) reduces to the KdV equation, which describes the evolution of nonlinear disturbances of small amplitude in plasmas and other types of dispersive media exhibiting dispersion of the type $\kappa = a\omega(1 \pm b^2 \omega^2)$.

The evolution of the non-linear excitations from an initial arbitrary waveform with frequency bandwidth $\omega < (\omega_p c/\beta)$ is obtained by numerical solution of eqn. (10). A Gaussian temporal profile is used (with amplitude and width denoted by $a_0$ and $w_0$, respectively) as the excitation at the point z=0, and the response of the 2DEG at various locations z>0 has been calculated. This corresponds to a feasible experimental configuration where the plasmon generation, via pulsed excitation, and detection occur at two different locations in space.

Figure 8:
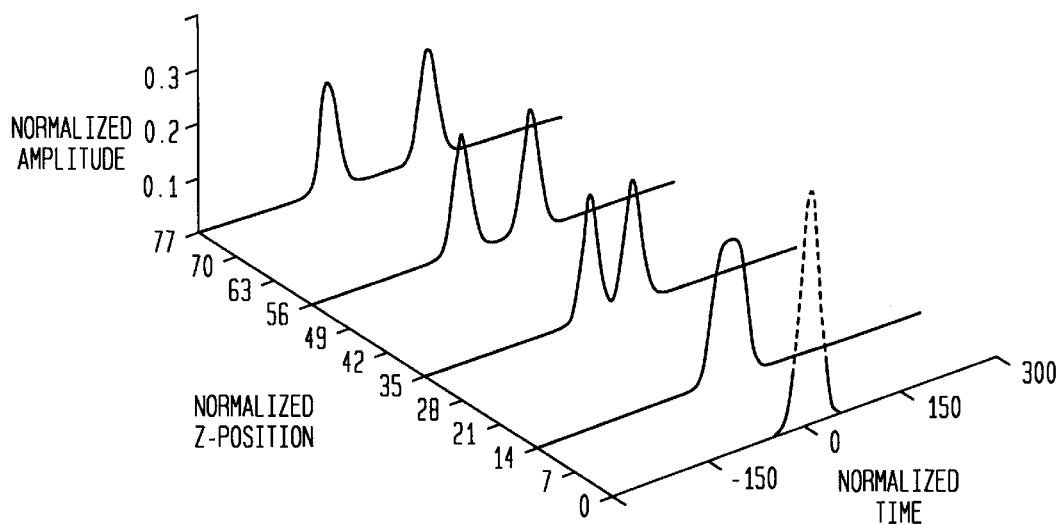
FIG. 8 is a graph of the evolution of the Gaussian pulse along the z-axis.

From numerical solution, we find that eqn. (10) admits a new class of localized excitations. FIG. 8 demonstrates the evolution of the Gaussian pulse into two such excitations at various values of the propagation direction, z. Note from FIG. 8 that the excitations are propagating in positive and negative time, such that only one pulse is observed for times t>0 at a particular location z>0. The shape of the excitation is unchanged for larger values of z.

Figure 9:
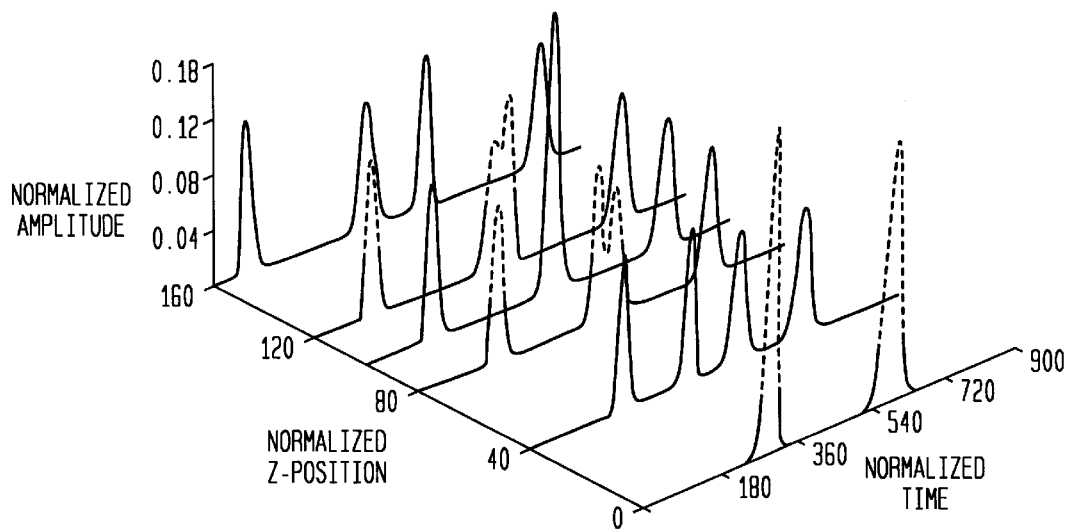
FIG. 9 is a graph of a succession of frames two Gaussian pulses of different amplitude and pulse width propagating towards one another.

FIG. 9 represents the results of the computer calculation for the collision of two of these localized, non-linear excitations. Equation (10) is solved with initial amplitude a(z,t) consisting of two Gaussian pulses of different amplitude and pulse width, shown at z=0, propagating towards one another. FIG. 9 depicts a succession of frames in space of the collision process. This figure demonstrates that these non-linear excitations do not scatter upon collision. Each initial Gaussian pulse evolves into two pulses, propagating in opposite directions. The colliding pulses emerge from the collision retaining the same velocity and profile with which they entered and thus behave as solitons, hereby referred to as 2-DEG solitons.

Note from eqns. (5) and (7) that the current density in the 2-DEG associated with the excitation is given by $J_z(x,z,\omega) = \phi'^z(x,\omega)a(z,\omega)$ for the single mode, where $\phi'^z(x,\omega)$ is the contribution to the eigenfunctions from the current density. Using the expression for the $\phi'^z(x,\omega)$ given in equation (7) and inverting back to the time domain, we find that $J_z(x,z,t) \partial_t a(z,t)$. The time derivative of the modal amplitude is thus directly proportional to the current density, a physical, measurable quantity.

The strength of the damping term in equation (10) is of the order $(2\omega_p\tau)^{-1} \approx 0.003$, evaluated in the Drude model for the high densities and mobilities (n=2.0×10$^{12}$ cm$^{-2}$; $\mu$=2.0×10$^6$ cm$^2$/Vs) that are presently being achieved in GaAs/AlGaAs heterostructures. Including this term in the numerical solution of equation (10) (using an initial Gaussian pulse with parameters $a_0$=0.4, $w_0$=10.0), the 2-DEG solution amplitude decays by 10% within a normalized distance z≈120. As can be seen from FIG. 9, this distance is much greater than the solution evolution length, z≈60. Therefore, neglect of the damping term is justified in this model within a propagation distance of twice the solution evolution length.

In conclusion, an equation of evolution for the non-linear excitation of a 2-DEG with a frequency bandwidth $\omega<(\omega_p c/\beta)$ has been presented. Numerical solution of this equation illustrates that an arbitrary input waveform will evolve in space into solitons containing a broad frequency spectrum that extends into the terahertz regime. As the search for better coupling schemes to plasmons continues, these results demonstrate a promising potential for devices for terahertz frequency applications.

Having thus described the invention in detail, it is to be understood that the foregoing description is not intended to limit the spirit and scope thereof. What is desired to be protected by Letters Patent is set forth in the appended claims.

What is claimed is:

1. An apparatus for generating, manipulating and detecting plasmons in semi-conductor heterostructures comprising:

a substrate;

upper layer of material placed over the substrate;

a two-dimensional electron gas well formed between the upper layer of material and the substrate;

launching means applied on the upper layer over the well; and receiving means positioned on the layer over the well, the launching means launching a plasmon that travels through the well to the receiving means where it can be received.

2. The apparatus of claim 1 further comprising modulating means positioned on the upper layer between the launching means and the receiving means for modulating the signal.

3. The apparatus of claim 1 wherein the launching means comprises first and second coplanar wave guides.

4. The apparatus of claim 3 wherein further including means for providing a pulsed electrical current to the first coplanar waveguide.

5. The apparatus of claim 4 wherein the first coplanar waveguide is interconnected with a photoconductive switch.

6. The apparatus of claim 5 further comprising laser means for operating and closing the photoconductive switch.

7. The apparatus of claim 1 wherein the launching means comprises three coplanar waveguides, the central waveguide being conductive and the outside waveguides being grounded.

8. The apparatus of claim 7 wherein the receiver comprises three coplanar waveguides.

9. The apparatus of claim 3 wherein one of the substrate or the upper layer comprises a high bandgap material and the other of the substrate or the upper layer comprises a lower bandgap material.

10. The apparatus of claim 9 wherein one of the substrate or the upper layer comprises AlGaAs and the other of the substrate or the upper layer comprises GaAs.

11. A method of using a plasmon in a semi-conductor heterostructure to allow for terahertz signaling comprising the steps of:

forming a two-dimensional electron gas well between a substrate and an upper layer, positioning launching means on the upper layer above the well;

positioning receiver means on the upper layer over well;

launching a plasmon at the launching means; and receiving the plasmon at the receiving means.

12. The method of claim 11 wherein the launching means comprises coplanar waveguides and the step of launching a plasmon comprises sending a pulsed electric charge through the coplanar waveguides to excite the electrons in the well therebelow.

13. The method of claim 12 wherein the receiving means comprises coplanar waveguides and the step of receiving the plasmon comprises propagating the plasmon through the well below the receiving coplanar waveguides and inducing a charge in the receiving coplanar waveguides which can be detected.

14. The method of claim 13 further comprising the step of modulating the plasmon as it travels between the launching means and the receiving means by modulating means positioned on the upper layer over the well.

15. The method of claim 14 wherein the modulating means comprises a gate and the step of modulating the plasmon comprises charging the gate to change the spatial arrangement of a two-dimensional electron gas in the well.

* * * * *